United States Patent
Beach

(10) Patent No.: US 8,742,450 B2
(45) Date of Patent: *Jun. 3, 2014

(54) III-NITRIDE MULTI-CHANNEL HETEROJUNCTION DEVICE

(71) Applicant: International Rectifier Corporation, El Segundo, CA (US)

(72) Inventor: Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/891,080

(22) Filed: May 9, 2013

(65) Prior Publication Data

US 2013/0240911 A1 Sep. 19, 2013

Related U.S. Application Data

(63) Continuation of application No. 11/238,206, filed on Sep. 29, 2005, now Pat. No. 8,441,030.

(60) Provisional application No. 60/614,675, filed on Sep. 30, 2004.

(51) Int. Cl.
*H01L 29/66* (2006.01)
*H01L 29/74* (2006.01)

(52) U.S. Cl.
USPC ........... 257/109; 257/107; 257/162; 257/192; 257/194; 257/E29.246; 257/E29.249

(58) Field of Classification Search
USPC ............ 257/107, 109, 192, 194, 201, E29.12, 257/E21.381, E29.246–E29.249
See application file for complete search history.

(56) References Cited

U.S. PATENT DOCUMENTS

| | | | | |
|---|---|---|---|---|
| 5,192,987 | A * | 3/1993 | Khan et al. | 257/183.1 |
| 7,078,743 | B2 * | 7/2006 | Murata et al. | 257/192 |
| 7,112,860 | B2 * | 9/2006 | Saxler | 257/416 |
| 7,417,257 | B2 * | 8/2008 | Beach et al. | 257/79 |
| 7,465,997 | B2 * | 12/2008 | Kinzer et al. | 257/401 |
| 7,649,215 | B2 * | 1/2010 | Beach | 257/194 |

* cited by examiner

*Primary Examiner* — Allison P Bernstein
(74) *Attorney, Agent, or Firm* — Farjami & Farjami LLP

(57) ABSTRACT

A III-nitride power semiconductor device that includes a plurality of III-nitride heterojunctions.

19 Claims, 5 Drawing Sheets

III-NITRIDE MULTI-CHANNEL HETEROJUNCTION DEVICE

This is a continuation of application Ser. No. 11/238,206 filed Sep. 29, 2005.

RELATED APPLICATION

This application is based on and claims benefit of U.S. Provisional Application No. 60/614,675, filed on Sep. 30, 2004, entitled III-Nitride Multi-Channel Heterojunction Interdigitated Rectifier, to which a claim of priority is hereby made and the disclosure of which is incorporated by reference.

BACKGROUND OF THE INVENTION

The present invention relates to power semiconductor devices and more particularly to heterojunction power semiconductor devices.

III-nitride heterojunction power semiconductor devices are desirable for power applications due to their high breakdown capability, and low ON resistance. U.S. patent application Ser. No. 11/004,212, assigned to the assignee of the present application illustrates an example of a III-nitride power semiconductor device.

Referring to FIG. 2, a III-nitride power semiconductor device as shown in U.S. patent application Ser. No. 11/004,212 includes substrate 28, buffer layer 30 disposed on substrate 28, a heterojunction 32 disposed on buffer layer 30, a protective layer 34 disposed on heterojunction 32, a schottky electrode 20 in schottky contact with heterojunction 32, and an ohmic contact 22 ohmically connected to heterojunction 32. Preferably, schottky contact 20 and ohmic contact 22 both include a field plate 36.

Heterojunction 32 includes a resistive III-nitride semiconductor body (resistive body) 38 and a III-nitride semiconductor barrier body (barrier body) 40 both formed with an alloy of InAlGaN. Resistive body 38 and barrier body 40 are selected so that the junction between the two creates a highly conductive two dimensional gas (2DEG) 42 due to spontaneous polarization and the piezoelectric effect as is well known in the art.

One known material for forming resistive body 38 is undoped GaN, and a known material for forming barrier body 40 is AlGaN.

SUMMARY OF THE INVENTION

A power semiconductor device according to the present invention includes at least a first III-nitride heterojunction and at least a second III-nitride heterojunction disposed over the first III-nitride heterojunction. As a result, a device according to the present invention includes a number of high density, high mobility 2DEG channels.

Specifically, each heterojunction is preferably formed with a thin first III-nitride semiconductor body of one InAlGaN alloy and a second thin semiconductor body of another InAlGaN alloy. For example, each layer can be between 10-1000 Å, and preferably between 150-300 Å. The multi layers of thin, but highly conductive heterojunction bodies result in a highly conductive power semiconductor device with a relatively high breakdown voltage.

A device according to the preferred embodiment is a lateral channel schottky type rectifier which includes schottky electrodes and ohmic electrodes alternately arranged in an interdigitated pattern resembling a comb to increase charge injection and extraction. The electrodes in the preferred embodiment are preferably disposed on the stack of at least two III-nitride heterojunctions. An example of such a structure is a stack of AlGaN/GaN/AlGaN/GaN disposed over a buffer layer and a substrate. Preferably, at least the bottom GaN layer is highly resistive; i.e. intrinsically doped, which means that it contains no more than residual doping, and is considered unintentionally doped.

In the example described above, under forward bias, the channel formed at the AlGaN/GaN interface can carry very large currents without the use of a thick doped region. In reverse bias, the channel is depleted of mobile charge, so that no current can flow in the channel, and the highly resistive nature of the underlying GaN prevents charge from flowing. In addition, when the AlGaN and the GaN are intrinsically doped low electric fields result under a reverse bias, allowing for very high standoff voltages without the corresponding adverse effects on the forward resistance. It should be noted that, depending on the intended device characteristics, the layers can be doped to obtain the desired trade off between mobility and breakdown ability.

Also, advantageously, the replacement of a doped current carrying layer with a highly conductive 2DEG drastically improves the RA product for a given breakdown voltage. Furthermore, the use of multiple layers of AlGaN/GaN results in increased current conduction, and the resistive GaN layer allows isolation of the device by etching away, for example, portions of AlGaN—GaN stack that surround the device. As a result it may be possible to integrate a number of devices on a single chip, thereby allowing for the fabrication of IC's that include a device according to the present invention.

Other features and advantages of the present invention will become apparent from the following description of the invention which refers to the accompanying drawings.

DETAILED DESCRIPTION OF EMBODIMENTS OF THE INVENTION

Figure 1:
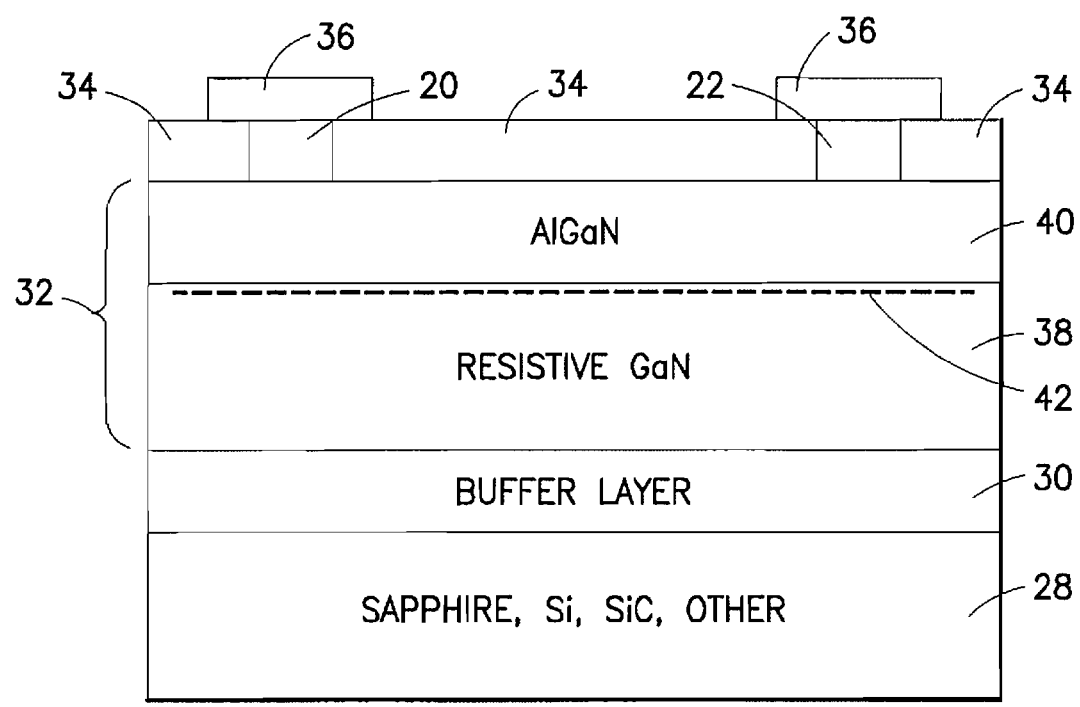
FIG. 1 schematically illustrates a cross-sectional view of a power device according to the prior art.
Figure 2:
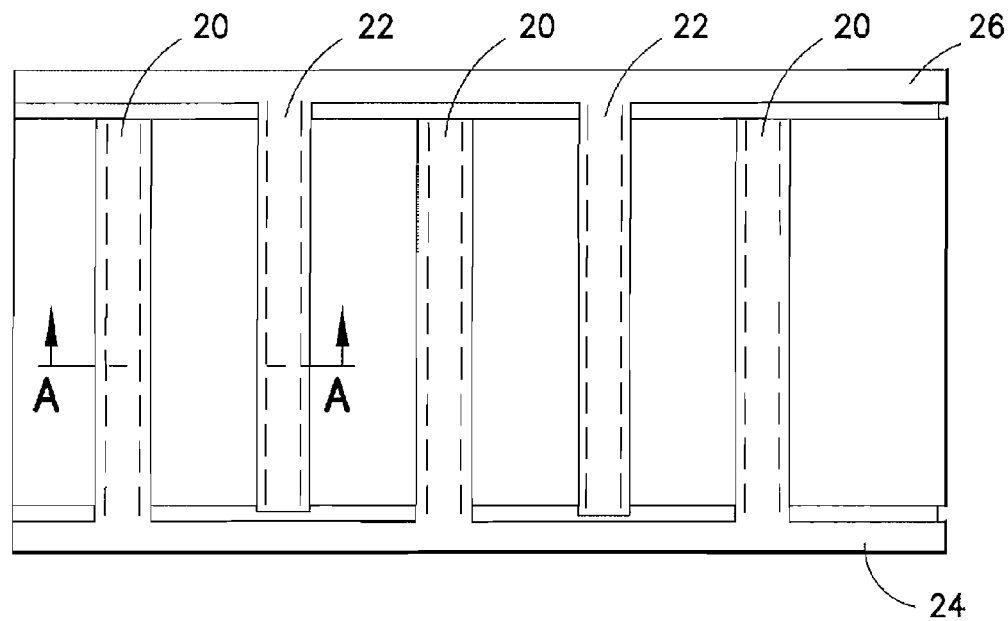
FIG. 2 shows a top plan view of a portion of an active cell of a device according to the present invention.

Referring to FIG. 2, a device according to an embodiment of the present invention includes a plurality of interdigitated power electrodes, namely schottky electrodes 20 and ohmic electrodes 22. Schottky electrodes 20 are connected to a common schottky feed 24 and ohmic electrodes 22 are connected to a common ohmic feed 26. Although not shown, one skilled in the art would understand that each common feed 24, 26 is connected electrically to a respective conductive pad for external connection.

Figure 3:
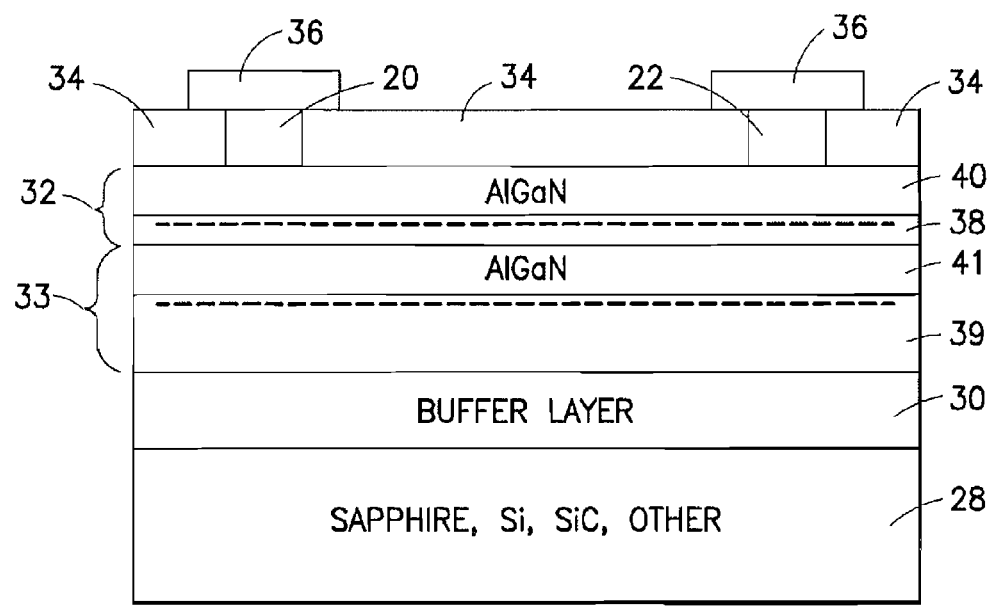
FIG. 3 shows a cross-sectional view of a portion of an active cell of a device according to an embodiment of the present invention along line A-A in FIG. 2 as seen in the direction of the arrows.

A device according to the present invention includes two or more III-nitride heterojunctions. Referring, for example, to FIG. 3, a power device according to the present invention includes another heterojunction 33 between heterojunction 32 and buffer layer 30. Heterojunction 33 preferably includes a III-nitride semiconductor resistive body (resistive body) 39, and a III-nitride semiconductor barrier body (barrier body) 41. Resistive body 39 and barrier body 41 are selected so that the junction between the two creates a highly conductive 2-DEG 42 as described above. In the preferred embodiment, resistive body 39 may be composed of undoped GaN, while barrier body 41 is preferably composed of AlGaN. It should be noted that other alloys of InAlGaN can be used to form either resistive body 39 or barrier body 41 without deviating from the spirit and the scope of the present invention.

In the preferred embodiment, substrate 28 is formed from silicon. It should be noted that substrate 28 can also be formed with SiC, sapphire, or any other suitable substrate. In addition, a compatible III-nitride semiconductor bulk material such as bulk GaN can be used as substrate 28, in which case, buffer layer 26 may be omitted when resistive body 38 is composed of intrinsic GaN.

Figure 4A:
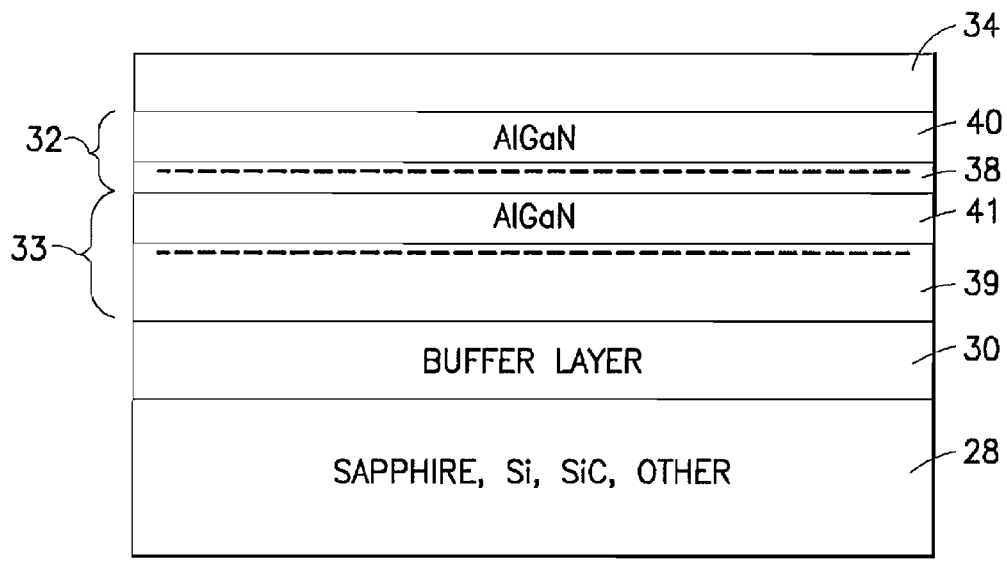
FIGS. 4A-4D schematically illustrate the fabrication of a device according to the present invention.
Figure 4B:
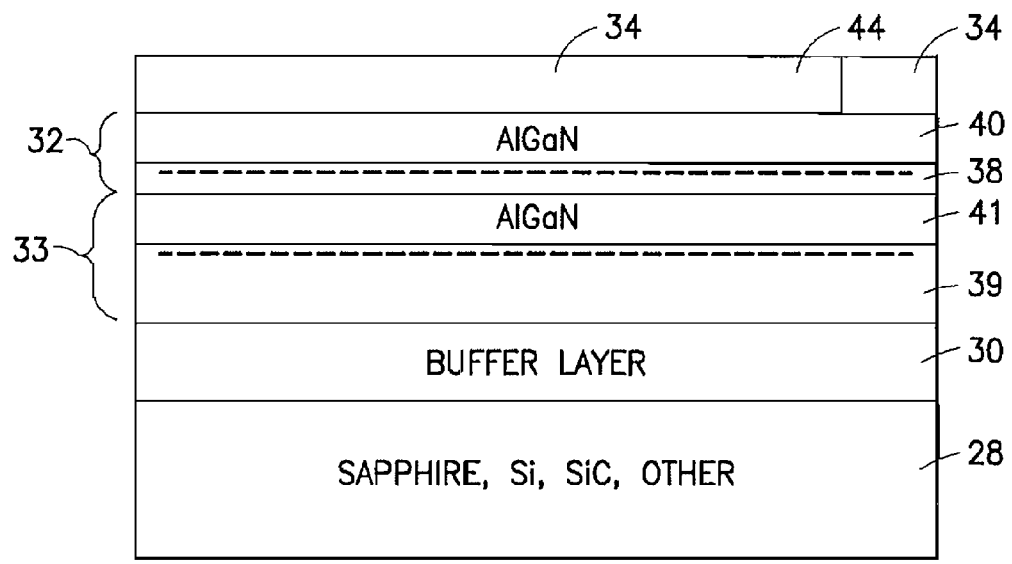

Referring to FIG. 4A, in order to fabricate a device according to the present invention a stack including substrate 28, buffer layer 30, heterojunction 32, heterojunction 33, and protective layer 34 is masked and etched to provide an opening 44 in protective layer 34 as illustrated schematically in FIG. 4B. Opening 44 reaches at least barrier body 40 of heterojunction 32.

Figure 4C:
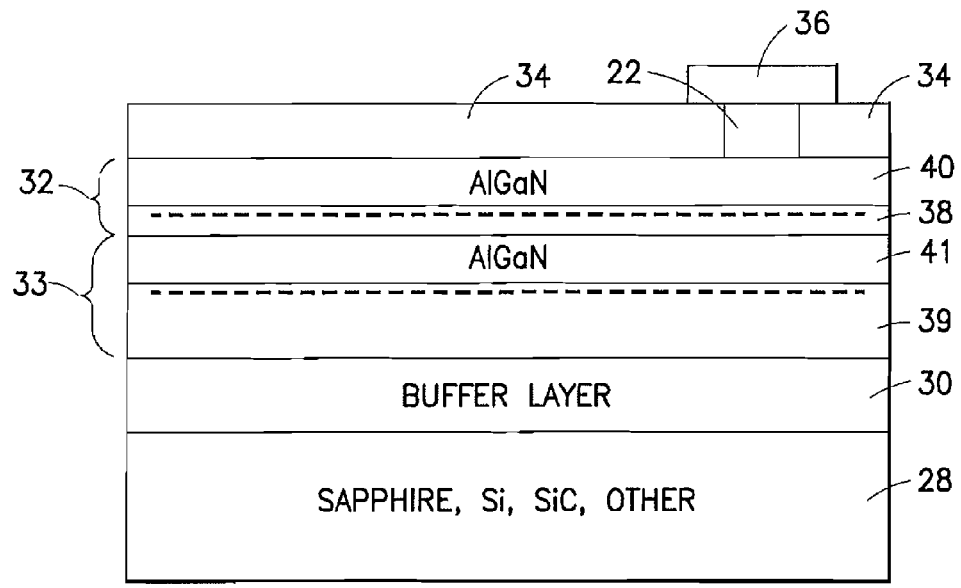
Figure 4D:
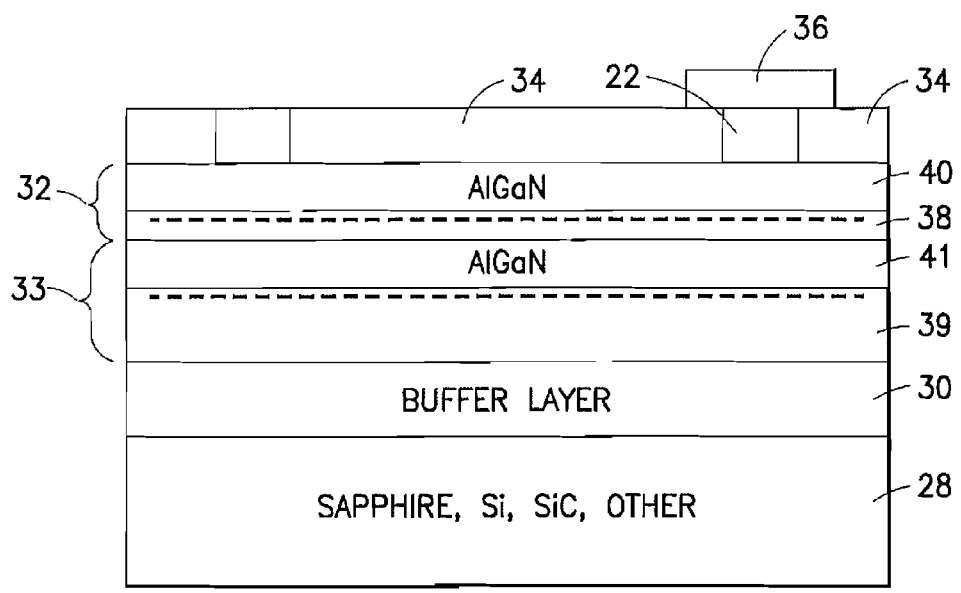

Next, ohmic electrode 22 is formed in opening 44 reaching at least and making ohmic contact with barrier body 40, resulting in the structure schematically illustrated by FIG. 4C. Ohmic electrode 22 is formed by depositing an ohmic metal followed by an annealing step. Thereafter, another opening 46 is formed in protective layer 34, opening 46 reaching at least barrier body 40, as shown schematically in FIG. 4D. Next, schottky electrode 20 is formed by depositing a schottky metal in opening 46 reaching at least and making schottky contact with barrier body 40. Field plate 36 is then formed atop schottky electrode 20, resulting in a device according to the embodiment shown in FIG. 3.

Figure 5:
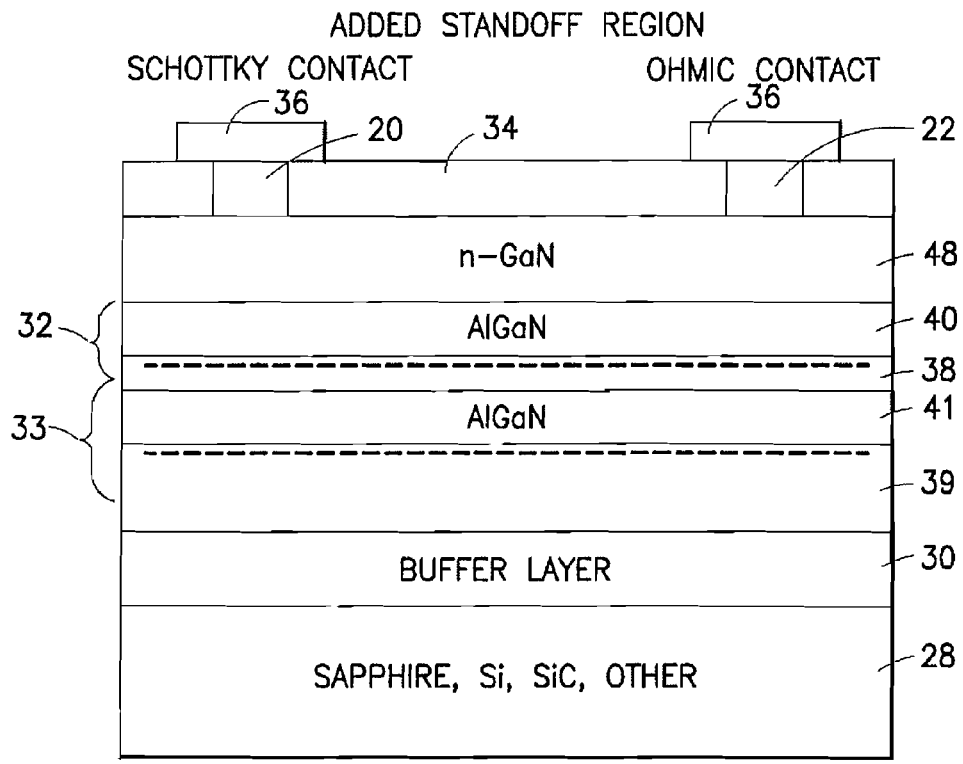
FIG. 5 schematically shows a cross-sectional view of a portion of a device according to an alternative embodiment of the present invention.

Referring next to FIG. 5, a device according to another embodiment includes a lightly doped III-nitride body 48, formed preferably from GaN, and disposed over heterojunctions 32, 33. In this embodiment, ohmic electrode 22 and schottky electrode 20 are connected to lightly doped III-nitride body 48. This structure is similar to a lateral conduction schottky, but exhibits an increased conductivity in the forward current carry direction.

Figure 6:
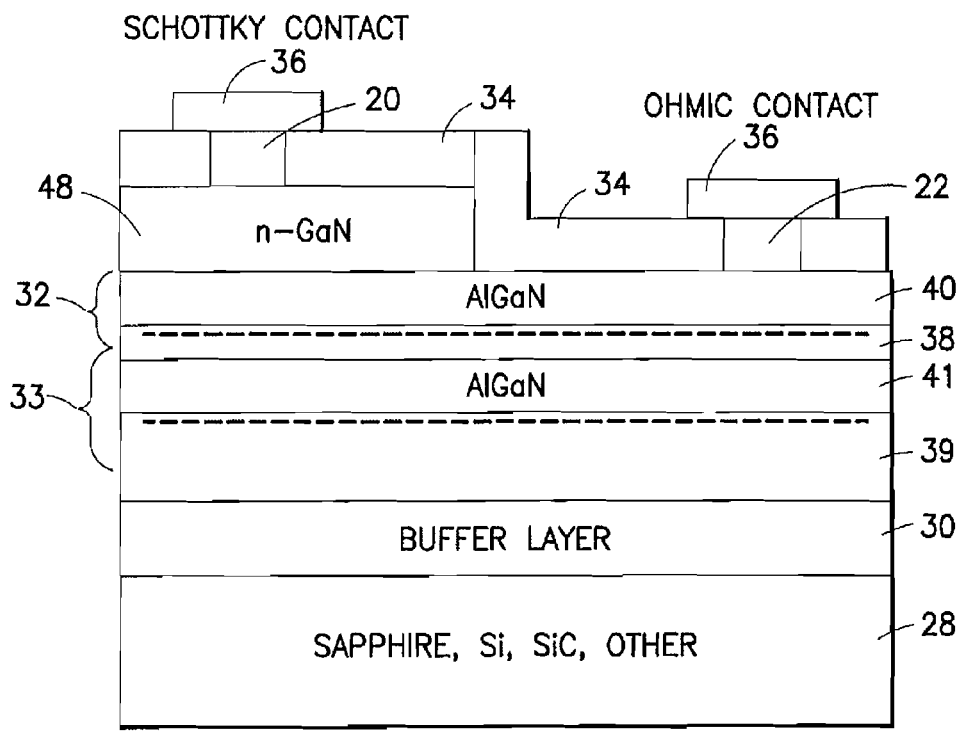
FIG. 6 schematically shows a variation of the embodiment shown in FIG. 5.

Referring to FIG. 6, in a modified version of the embodiment shown in FIG. 5, a recess is provided in lightly doped III-nitride body 48 to allow ohmic electrode 22 to be positioned on a plane below the plane of schottky electrode 20 and to ohmically connect to heterojunction 32.

It should be noted that protective layer 34 can be made from a material that retards or prevents the out diffusion of nitrogen during the annealing step. A nitrogen rich material may be suitable for this purpose. For example, AlN, HfN, AlGaN, highly doped GaN, highly doped poly GaN, and LPCVD Si$_3$N$_4$ are among materials suitable for forming protective layer 34. Also, in the preferred embodiment ohmic electrode 22 may be formed from an Al/Ti body such as Ti/Al/Ti/TiW, Ti/Al/Ni/Au, or the like, while schottky electrode 20 may be formed from Ni/Au, Pt/Au, Pd/Au, Au, TiW, Ni/TiW, Ni/TiN, or the like. It should be noted that the materials noted herein are preferred, but that other materials may be used without deviating from the scope and spirit of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
   a first III-nitride heterojunction;
   a second III-nitride heterojunction over said first III-nitride heterojunction;
   a plurality of schottky electrodes electrically connected to said second III-nitride heterojunction;
   a plurality of ohmic electrodes electrically connected to said second III-nitride heterojunction;
   wherein said plurality of schottky electrodes and said plurality of ohmic electrodes are alternately arranged in an interdigitated layout, and wherein said first and second III-nitride heterojunctions are configured to form at least two two-dimensional electron gas (2DEG) channels.

2. The power semiconductor device of claim 1, wherein said first III-nitride heterojunction includes a first III-nitride semiconductor body comprising an alloy of InAlGaN, and a second III-nitride semiconductor body comprising another alloy of InAlGaN.

3. The power semiconductor device of claim 2, wherein said first III-nitride semiconductor body further comprises AlGaN, and said second III-nitride semiconductor body further comprises GaN.

4. The power semiconductor device of claim 2, wherein said second III-nitride semiconductor body is undoped.

5. The power semiconductor device of claim 1, wherein said second III-nitride heterojunction includes a first III-nitride semiconductor body comprising an alloy of InAlGaN, and a second III-nitride semiconductor body comprising another alloy of InAlGaN.

6. The power semiconductor device of claim 5, wherein said first III-nitride semiconductor body further comprises AlGaN, and said second III-nitride semiconductor body further comprises GaN.

7. The power semiconductor device of claim 5, wherein said second III-nitride semiconductor body is undoped.

8. The power semiconductor device of claim 1, further comprising a buffer layer disposed between said first III-nitride heterojunction and a substrate.

9. The power semiconductor device of claim 8, wherein said buffer layer comprises AlN.

10. The power semiconductor device of claim 8, wherein said substrate is selected from the group consisting of Si, SiC, and Sapphire.

11. The power semiconductor device of claim 1, further including a substrate comprising GaN.

12. The power semiconductor device of claim 1, wherein each of said plurality of schottky electrodes is connected to a first electrical feed, and each of said plurality of ohmic electrodes is connected to a second electrical feed.

13. The power semiconductor device of claim 1, further comprising a protective layer that prevents out diffusion of nitrogen.

14. The power semiconductor device of claim 13, wherein said protective layer is nitrogen rich.

15. The power semiconductor device of claim 13, wherein said protective layer comprises at least one of AlN, HfN, AlGaN, highly doped GaN, highly doped poly GaN, and LPCVD Si3N4.

16. The power semiconductor device of claim 1, further comprising a lightly doped III-nitride body interposed between each of said plurality of schottky electrodes and said second III-nitride heterojunction.

17. The power semiconductor device of claim 16, wherein said lightly doped III-nitride body comprises GaN.

18. The power semiconductor device of claim 1, further comprising a lightly doped III-nitride body interposed between each of said plurality of schottky electrodes and each of said plurality of ohmic electrodes.

19. The power semiconductor device of claim 18, wherein said lightly doped III-nitride body comprises GaN.

\* \* \* \* \*